US006218897B1

(12) United States Patent
Barzegar et al.

(10) Patent No.: US 6,218,897 B1
(45) Date of Patent: Apr. 17, 2001

(54) RECONFIGURABLE LINEAR POWER AMPLIFIER

(75) Inventors: Farhad Barzegar, Branchburg; Irwin Gerszberg, Kendall Park; Jeremiah Okoro, Landing, all of NJ (US)

(73) Assignee: AT&T Corp, New York, NY (US)

( * ) Notice: Subject to any disclaimer, the term of this patent is extended or adjusted under 35 U.S.C. 154(b) by 0 days.

(21) Appl. No.: 09/467,886

(22) Filed: Dec. 21, 1999

Related U.S. Application Data
(60) Provisional application No. 60/113,711, filed on Dec. 24, 1998.

(51) Int. Cl.[7] ............... H03F 1/14; H03F 3/68; H03F 3/04; H03G 3/00
(52) U.S. Cl. ............ 330/51; 330/127; 330/126; 330/297
(58) Field of Search ............ 330/51, 127, 129, 330/297, 124 R, 126

(56) References Cited

U.S. PATENT DOCUMENTS

| | | | |
|---|---|---|---|
| 4,115,739 | * 9/1978 | Sano et al. ............ | 330/297 |
| 4,644,301 | * 2/1987 | Hecht ............ | 330/124 D |
| 4,801,890 | * 1/1989 | Dolby ............ | 330/126 |
| 5,164,680 | * 11/1992 | Mahabadi ............ | 330/297 |
| 6,118,343 | * 9/2000 | Winslow ............ | 330/51 |

* cited by examiner

Primary Examiner—Robert Pascal
Assistant Examiner—Patricia T. Nguyen

(57) ABSTRACT

A power amplifier includes a first amplifier, a second amplifier, a transfer switch and a controller. The first amplifier amplifies a first frequency bandwidth, and the second amplifies a second frequency bandwidth. The second frequency bandwidth is less than the first frequency bandwidth. The transfer switch includes a first input port, a second input port, a first output port and a second output port. The first input port is connected to a primary power source, while the second input port is connected to a battery. The first output port is connected to the first amplifier and the second output port is connected to the second amplifier. The controller controls the transfer switch to connect the first primary power source to the first amplifier in a primary mode of operation. The controller also controls the transfer switch to connect the battery to the second amplifier in a second mode of operation.

3 Claims, 2 Drawing Sheets

RECONFIGURABLE LINEAR POWER AMPLIFIER

This application claims the benefit of U.S. Provisional Application No. 60/113,711 filed Dec. 24, 1998.

FIELD OF THE INVENTION

The present invention relates to telecommunication systems. More specifically, the present invention is directed to systems and methods for reconfiguring a power amplifier during a power outage.

BACKGROUND OF THE INVENTION

Modern communication systems provide an increasing number of services to consumers. For example, wireline telecommunications systems previously provided simultaneous voice and data service, while wireless telecommunications provided either voice service or data service, but not both simultaneously. Lately, wireless telecommunication systems provide simultaneous voice and data services by increasing communication channel bandwidth to handle the increased service requirements.

As the bandwidth of a system increases, the power required for amplifying signals within the bandwidth correspondingly increases. Many communication systems use a battery backup during a power outage. Unfortunately, battery lifetime decreases as system bandwidth increases. Consequently, battery-backup systems are becoming increasingly less reliable.

Accordingly, there is a need for a communication system that operates in a manner that increases the battery lifetime of a battery backup, thereby increasing the reliability of the battery back up.

SUMMARY OF THE INVENTION

The present invention provides a communication system that operates in a manner that increases the battery lifetime of a battery backup, thereby increasing the reliability of the battery backup.

The advantages of the present invention are provided by a power amplifier that reconfigures itself during a power outage and amplifies only a selected bandwidth when the battery backup is in use. In that regard, the information associated with the essential services provided by a communication channel is arranged to be within a selected portion bandwidth of the channel. During a power outage, the power amplifier of the present invention amplifies only the selected portion of the bandwidth, which contains the essential services provided by the communication channel. The battery lifetime of the battery backup is accordingly increased.

According to the invention, a power amplifier includes a first amplifier having a first operational bandwidth and a second amplifier having a second operational bandwidth that is narrower than the first operational bandwidth. A primary power source is connected to a first input port of a transfer switch and a battery is connected to a second input port of the transfer switch. The power amplifier also includes a controller for controlling the transfer switch to connect the first amplifier to the primary power source during a primary mode of operation, and for controlling the transfer switch to connect the second amplifier to the battery when the primary power source malfunctions.

BRIEF DESCRIPTION OF THE DRAWINGS

The present invention is illustrated by way of example and not limited in the accompanying figures in which like reference numerals indicate similar elements and in which.

DETAILED DESCRIPTION OF PREFERRED EMBODIMENTS

Figure 1:
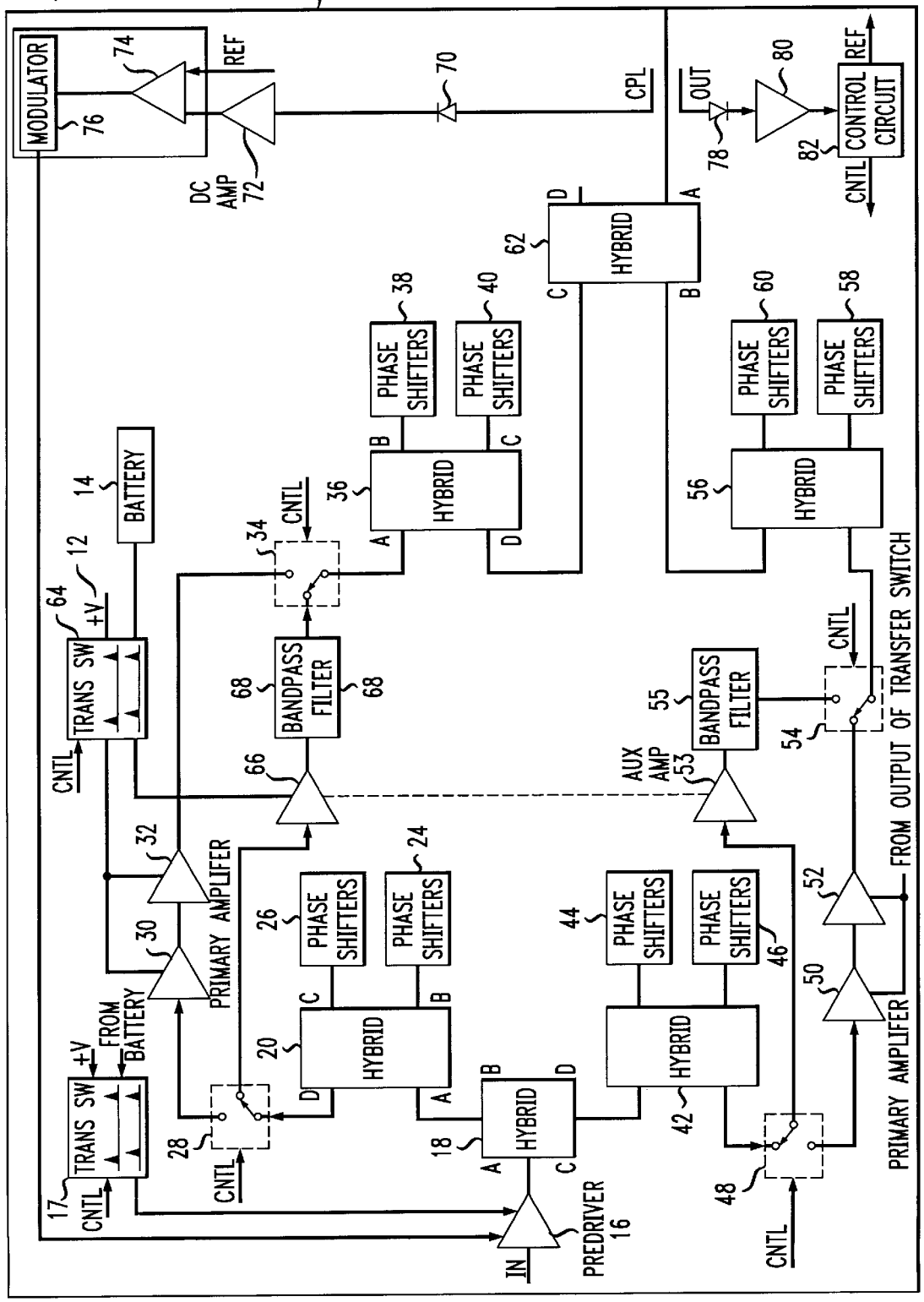
FIG. 1 is a schematic block diagram of a reconfigurable power amplifier according to a first preferred embodiment of the present invention.

FIG. 1 shows a reconfigurable power amplifier 10 according to a first embodiment of the present invention. Amplifier 10 operates in a primary mode of operation or an auxiliary mode of operation. In the primary mode, a primary power supply 12 provides power to amplifier 10. In the auxiliary mode, a battery 14 provides power to amplifier 10.

In both modes of operation, a predriver amplifier 16 receives an input signal that is amplified by predriver amplifier 16 and is output to a hybrid 18. In the primary mode of operation, primary power supply 12 supplies power to predriver amplifier 16 through a transfer switch 17. Hybrid 18 splits the incoming signal into two signals that are phase shifted 90° with respect to one another. The signal output from port B of hybrid 18 will be described in detail below with the understanding that the signal that leaves port D of hybrid 18 undergoes a similar amplification process in the lower portion of FIG. 1. The respective signals output from hybrid 18 and are separately amplified are eventually recombined at a hybrid 62.

The signal that is output from port B of hybrid 18 is input to port A of a hybrid 20. Hybrid 20 allows for addition of additional amplification circuits. As shown in FIG. 1, hybrid 20 operates as a 180° phase shifter when configured with a phase shifter 26 connected to port C and a phase shifter 24 connected to port B. The signal that is input to port A of hybrid 20 is phase shifted by 180° and appears at the output of port D.

Preferably, phase shifters 24 and 26 are each formed from a PIN diode in parallel with a capacitor and an inductor. The PIN diode is preferably a high power PIN diode. Phase shifters 24 and 26 are constructed to reflect the incoming signals by approximately 180°. When additional amplifier stages are required, phase shifters 24 and 26 are accordingly replaced with additional amplifier stages. The construction and interconnections of the additional amplifier stages will become apparent from the following description.

The signal that is output from port D of hybrid 20 passes through a switch 28. In the primary mode of operation, switch 28 is configured to connect port D of hybrid 20 to the input of a first amplifier 30. Preferably, amplifier 30 is a broadband power amplifier. The output of amplifier 30 is input to another broadband power amplifier 32. While FIG. 1 shows two amplifiers 30 and 32, amplifiers 30 and 32 can be replaced by one or more broadband power amplifier (not shown). The number of broadband power amplifiers is chosen to correspond with the desired overall gain of the power amplifier 10. The signal output from amplifier 32 is input to a switch 34. In the primary mode of operation, switch 34 is configured to connect the output of amplifier 32 to port A of a hybrid 36.

In the primary mode of operation, primary power supply 12 supplies power to amplifiers 30 and 32 through a transfer switch 64. In the auxiliary mode of operation, switches 28, 34 and 64 are reconfigured to change the signal path of the amplified signal. In particular, in the auxiliary mode, the signal output from switch 28 is input to an auxiliary amplifier 66 instead of being input to primary amplifier 30.

Moreover, amplifier 66 receives power from battery 14 through transfer switch 64 in the auxiliary mode of operation.

Amplifier 66 consumes less power than the power consumed by the combination of amplifiers 30 and 32. The reduced power consumption is achieved by designing amplifier 66 to amplify a narrower bandwidth than the bandwidth amplified by amplifiers 30 and 32. Amplifier 66 is designed to amplify only the portion of the bandwidth that contains the essential services. The gain of amplifier 66 is preferably equivalent to that of amplifiers 30 and 32, but for the narrower bandwidth.

The signal output from amplifier 66 passes through a bandpass filter 68. Bandpass filter 68 passes frequencies corresponding to the essential services of the communication channel amplified by amplifier 10. In other embodiments, bandpass filter 68 may be a high pass or low pass filter. The frequency band passed by bandpass filter 68 is selected to correspond to the selected frequency band of the communication channel containing the essential services along.

The signal output from switch 34 is input to port A of hybrid 36. Like hybrid 20, hybrid 36 is used for facilitating additional amplifier stages (not shown). Hybrid 36 includes a phase shifter 38 connected to port B and a phase shifter 40 connected to port C. Preferably, phase shifters 38 and 40 have the same construction and purpose as phase shifters 26 and 24. As shown in FIG. 1, only one amplifier stage is between hybrid 20 and hybrid 36. An additional amplifier stage (not shown) may be added, for example, by replacing phase shifter 26 and phase shifter 38 with circuit components that perform the same or similar function as the components that are placed between port D of hybrid 20 and port A of hybrid 36. Similarly, an additional amplifier stage (not shown) may be added by replacing phase shifter 24 and phase shifter 40 with corresponding circuit components. The signal output from port D of hybrid 36 is phase shifted 180° and is input to port C of a hybrid 62.

The lower portion of FIG. 1 corresponds to the upper portion of FIG. 1 in configuration and operation. That is, lower portion hybrid 42 corresponds to upper portion hybrid 20. Similarly, lower portion switch 48 corresponds to upper portion switch 28, and so on. In that regard, the signal output from port D of hybrid 18 is amplified in a manner similar to the signal output from port B of hybrid 18, and the output of port D of lower portion hybrid 56 is input to port B of hybrid 62.

Hybrid 62 is a 90° hybrid that functions as a combiner. The respective signals that pass through the upper portion of power amplifier 10 and the lower portion of power amplifier 10 are input to ports C and B of hybrid 62, respectively. The signals applied to hybrid 62 have a phase difference of 90°. Hybrid 62 combines the upper and lower portion signals and outputs the combined signal at port A. The signal output from port A of hybrid 62 is an amplified version of the signal input to predriver 16.

The power amplifier of FIG. 1 also includes a circuit for automatically adjusting the gain of the amplifier. The signal output from port A of hybrid 62 is detected by a detector 70. The output of detector 70 is input to a DC amplifier 72. The output of DC amplifier 72 and a reference signal are compared by a comparator 74. The output of the comparator 74 is input to a modulator 76. Based on the signal received from the comparator 74, modulator 76 produces an output that is applied to predriver circuit 16. The output of modulator 76 is used for adjusting the gain of the predriver circuit 16 so that the output of linear power amplifier 10 remains at a desired level.

The output of port A of hybrid 62 is also detected by another detector 78. The output of detector 78 is amplified by a DC amplifier 80 and input to a control circuit 82. Control circuit 82 produces a reference signal and a control signal. The reference signal can be varied by adjusting a programmable digital attenuator (not shown) to set the level of the output power of linear power amplifier 10. The reference signal generated by control circuit 82 is input to comparator 74. Control circuit 82 also determines when a power outage occurs in a well-known manner. When a power outage is detected by control 82, control circuit 82 outputs a control signal to switches 17, 28, 34, 48, 54 and 64 that causes the switches to switch from the primary mode to the auxiliary mode.

Figure 2:
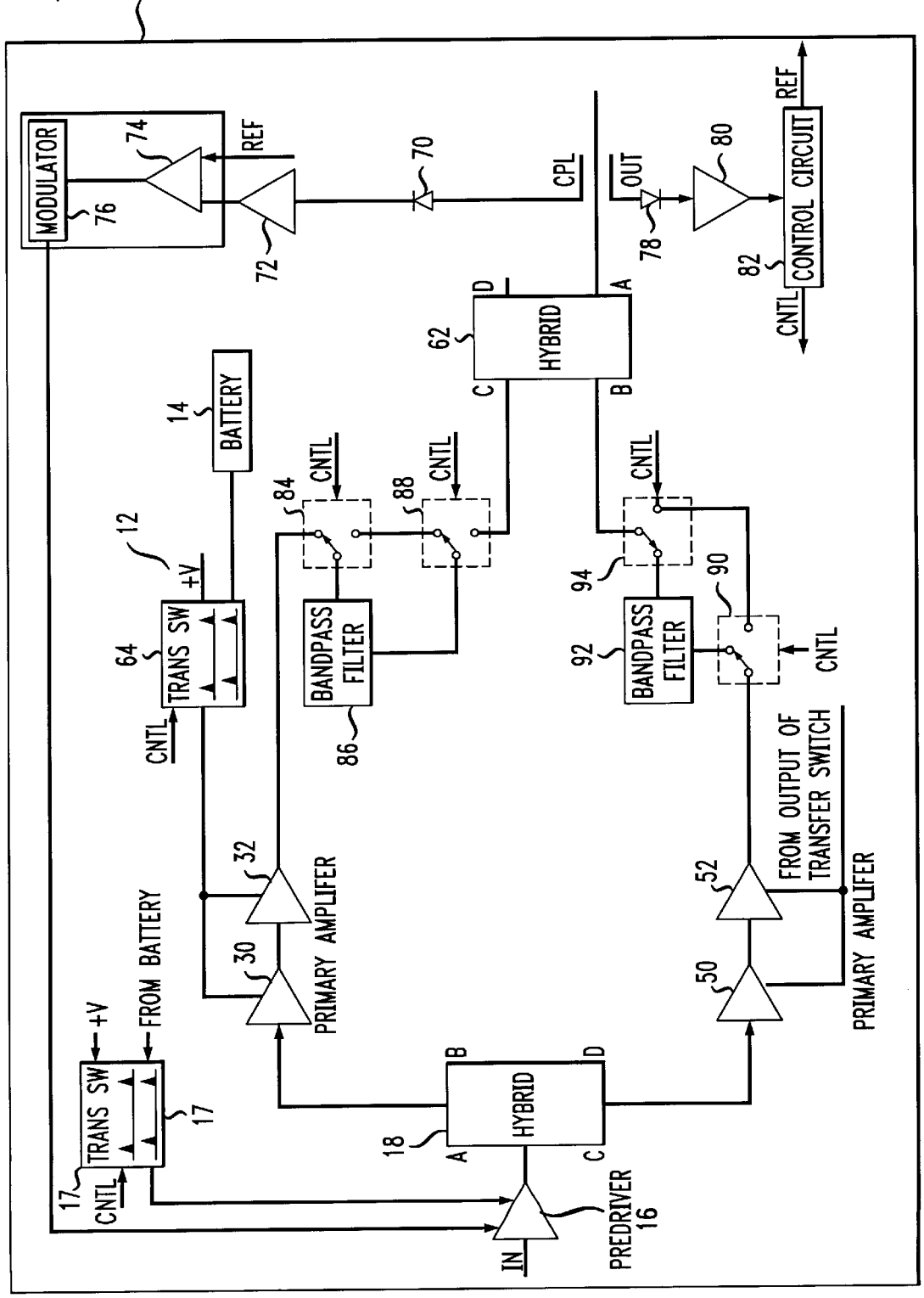
FIG. 2 is a schematic block diagram of a reconfigurable power amplifier according to a second preferred embodiment of the present invention.

A second reconfigurable power amplifier 11 is shown in FIG. 2. Amplifier 11 includes many components that are the same as the components of amplifier 10, shown FIG. 1. The components that are the same have been labeled with the same reference numerals, and function as described previously. The upper portion signal that is output from port B of hybrid 18 and subsequently input to port C of hybrid 62 will be described in detail. It should be understood that the lower portion signal that is output from port D of hybrid 18 and subsequently input to port B of hybrid 62 is amplified in a manner similar to that of the upper portion signal.

The signal output from port B of hybrid 18 is input to a first amplifier 30. The output of amplifier 30 is input to a second amplifier 32. In the primary mode of operation, a switch 64 is configured to connect a primary power source 12 to amplifiers 30 and 32. Additionally, switches 84 and 88 are configured to the output of amplifier 32 directly to port C of hybrid 62.

In the auxiliary mode of operation, switch 64 is configured to connect battery 14 to amplifiers 30 and 32. Furthermore, in the auxiliary mode of operation, switches 84 and 88 are configured to connect the signal output from amplifier 32 through a bandpass filter 86 before being input to port C of hybrid 62. Bandpass filter 86 passes only the frequencies corresponding to the selected frequencies of the communication channel containing the essential services.

In the auxiliary mode of operation, the signal input to predriver amplifier 16 is a signal having a reduced bandwidth corresponding only to the essential services of the communication channel. Amplifiers 30 and 32 accordingly consume less power when amplifying a reduced bandwidth. Consequently, amplifiers 30 and 32 consume less power in the auxiliary mode than in the primary mode of operation. Bandpass filter 86 is included to ensure that only the frequency range corresponding to the selected frequencies of the communication channel containing the essential services passes to hybrid 62. The respective signals input to port C and port B of hybrid 62 are combined and output at port A of hybrid 62.

The lower portion of FIG. 2 corresponds to the upper portion of FIG. 2 in configuration and operation. The signal output from port D of hybrid 18 is amplified in a manner similar to the signal output from port B of hybrid 18. In that regard, lower portion components 50, 52, 90, 92 and 94 correspond to upper portion components 30, 32, 84, 86 and 88, respectively.

While the present invention has been described in connection with the illustrated embodiments, it will be appreciated and understood that modifications may be made without departing from the true spirit and scope of the invention.

What is claimed is:

1. A power amplifier, comprising:

a first amplifier amplifying a first frequency bandwidth;

a second amplifier amplifying a second frequency bandwidth, the second frequency bandwidth being less than the first frequency bandwidth;

a transfer switch having a first input port, a second input port, a first output port and a second output port, the first input port being connected to a primary power source, the second input port being connected to a battery, the first output port being connected to the first amplifier and the second output port being connected to the second amplifier; and a controller controlling the transfer switch to connect the first primary power source to the first amplifier in a primary mode of operation and for controlling the transfer switch to connect the battery to the second amplifier in a second mode of operation.

2. A power amplifier, comprising:

a first amplifier receiving an input signal having a first frequency bandwidth of a communication channel, a selected portion of the first frequency bandwidth containing essential information of the communication channel;

a second amplifier receiving the input signal having a second frequency bandwidth of the communication channel, the second frequency bandwidth being less than the first frequency bandwidth and including the selected portion of the first frequency bandwidth;

a transfer switch having a first input port, a second input port, a first output port and a second output port, the first input port being connected to a primary power source, the second input port being connected to a battery, the first output port being connected to the first amplifier and the second output port being connected to the second amplifier; and a controller controlling the transfer switch to connect the first primary power source to the first amplifier and to disconnect the battery from the second power amplifier in a first mode of operation, and controlling the transfer switch to disconnect the primary power source from the first amplifier and to connect the battery to the second amplifier in a second mode of operation.

3. A power amplifier, comprising:

an amplifier circuit having an input port and an output port, the input port receiving a first input signal in a first mode of operation, the first input signal having a first frequency bandwidth of a communication channel, a selected portion of the first frequency bandwidth containing essential information of the communication channel, the input port receiving a second input signal in a second mode of operation, the second input signal having a second frequency bandwidth of the communication channel, the second frequency bandwidth being less than the first frequency bandwidth and including the selected portion of the first frequency bandwidth; and a transfer switch connected to the output port of the amplifier circuit, the transfer switch having a bandwidth at least as large as the first frequency bandwidth in the first mode of operation, and having a bandwidth that is substantially equal to the second frequency bandwidth in the second mode of operation.

* * * * *